United States Patent [19]

Bodnar et al.

[11] Patent Number: 4,737,888
[45] Date of Patent: Apr. 12, 1988

[54] RECEPTACLE ASSEMBLY AND MOUNTING BRACKET FOR CIRCUIT BOARD CONNECTIONS

[75] Inventors: Michael Bodnar, W. Chicago; Bruno Baumanis, River Forest, both of Ill.

[73] Assignee: Molex Incorporated, Lisle, Ill.

[21] Appl. No.: 899,286

[22] Filed: Aug. 22, 1986

[51] Int. Cl.[4] .............................................. H05K 7/12
[52] U.S. Cl. .................................. 361/427; 361/413; 439/78; 439/108
[58] Field of Search .............. 339/17 C, 17 LC, 14 R, 339/91 R, 176 M, 176 MP; 361/413, 417–420, 427

[56] References Cited

U.S. PATENT DOCUMENTS

| 3,149,897 | 9/1964 | Martineck | 339/91 R |
| 4,070,081 | 1/1978 | Takahashi | 339/91 R |
| 4,168,877 | 9/1979 | Little et al. | 361/413 |
| 4,464,003 | 8/1984 | Goudman et al. | 339/14 R |
| 4,605,269 | 8/1986 | Cohen et al. | 339/17 LC |

FOREIGN PATENT DOCUMENTS 1160044 7/1969 United Kingdom .............. 339/17 C

OTHER PUBLICATIONS

Maples et al., "Flat Cable Pluggable Connector", IBM Technical Disclosure Bulletin, vol. 20, No. 6, 11/77, pp. 2169–2170.

Primary Examiner—A. D. Pellinen
Assistant Examiner—Gregory D. Thompson
Attorney, Agent, or Firm—John W. Cornell; Louis A. Hecht

[57] ABSTRACT

A receptacle assembly for making electrical connections to a circuit board mounted in a chassis facilitates assembly of the components and avoids damage to the circuit board connections due to vibrations and shock. The assembly includes a receptacle connector having a housing adapted to be supported on a panel of the chassis and a plurality of terminals supported within the housing. A mounting bracket has a base portion and a grounding bracket clamps the base against the circuit board. Apertures in the base are aligned with a pattern of holes in the circuit board. A flange on the grounding bracket is attached to the panel and a standoff on the grounding bracket positions the mounting bracket and the circuit board in the chassis. A length of multiple conductor flexible cable has conductors with first ends connected to the terminals of the receptacle connector and second ends extending through the apertures for connection to the circuit board. The mounting bracket is also provided with upstanding latch arms including a shelf support portion which cooperate with the connector housing to releasably retain the housing on the bracket, supported in position spaced above the base.

12 Claims, 3 Drawing Sheets

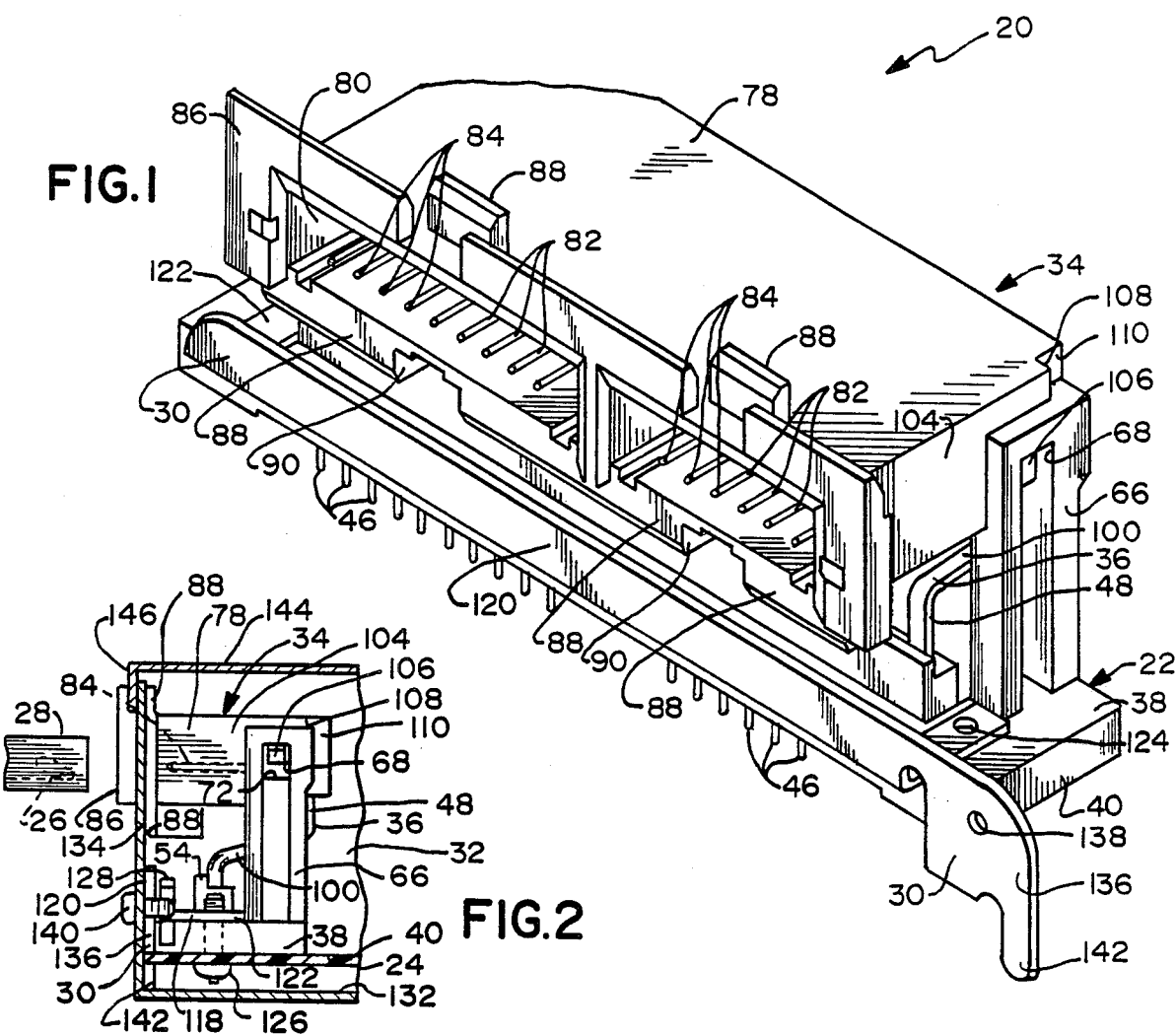
FIG.1
FIG.2
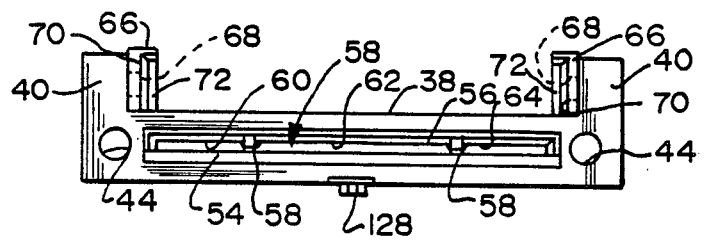
FIG.3
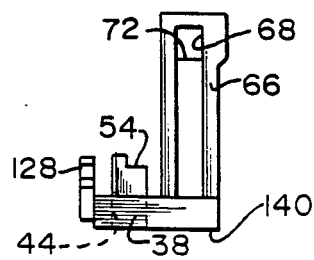
FIG.5
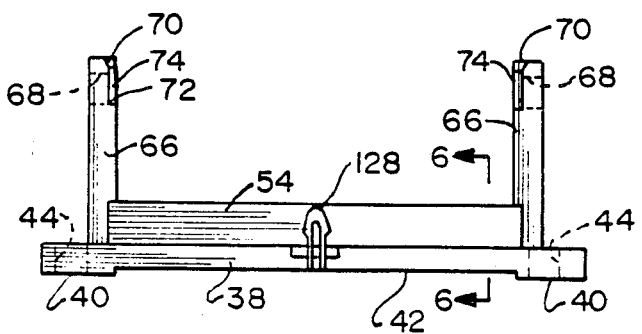
FIG.4

RECEPTACLE ASSEMBLY AND MOUNTING BRACKET FOR CIRCUIT BOARD CONNECTIONS

BACKGROUND OF THE INVENTION

1. Field of the Invention

The present invention relates to electrical connectors and more particularly to a receptacle assembly and mounting bracket for making electrical connections between a mateable electrical connector and a circuit board.

2. Description of the Prior Art

Many types of electrical connectors have been used for making electrical connections to conductive areas on printed circuit boards. One known approach is to connect cable conductors directly to conductive areas on the circuit board. German specification DE No. 3405 126 A 1 discloses a connecting plug providing stress relief for the conductors of a ribbon cable. The plug is a two part device, and when assembled to a cable, stripped ends of the conductors extend in a linear array from the plug. German specification No. DE No. 3004 072 C discloses a guide block for receiving flat cable with its wire ends bared. The block can be mounted on a circuit board with the wire ends positioned for soldering to the board. This approach does not provide a releasable connection to the circuit board.

To provide a releasable connection connector pins or wafers including pin terminals, either straight or right angle, may be soldered to conductive regions of a circuit board and interconnected with a mating electrical connector. Connectors using more complex types of terminals can also be connected by through hole soldering or surface mounting techniques to a circuit board and mated to a releasable connector.

These known approaches, although widely used and successful for many purposes, are subject to disadvantages under certain conditions. In some installations, shocks and vibrations may be applied from the mating connector to the solder interface with the circuit board, leading to degradation of the solder connection and unreliability of the circuit connections. In addition, known connector systems are not well adapted for use with circuit boards installed behind a panel or in a chassis where electrical connections are made to a connector which is panel mounted and connected to the circuit board.

SUMMARY OF THE INVENTION

Among the objects of the present invention are to provide an improved receptacle assembly and mounting bracket for electrical connection to circuit boards; to provide an electrical connector assembly in which stress applied to circuit board solder joints is reduced; to provide a receptacle assembly and mounting bracket offering improvements both in reliability and assembly procedures when used with a circuit board mounted adjacent a panel or in a chassis; and to provide improvements in electrical connectors and assemblies for printed circuit boards overcoming disadvantages of those used in the past.

In brief, these and other objects of the present invention are achieved by providing a mounting bracket for use in electrically connecting a connector to a circuit board having spaced apart surfaces and an array of through holes extending between the surfaces, the array of through holes being in a pattern matching the array of conductors in a flexible cable. The mounting bracket includes a base adapted to be mounted on one of the circuit board surfaces. An attachment structure on the base serves to attach the base to the printed circuit board with the base overlying the array of through holes. An aperture structure extends through the base in alignment with the array of through holes in the circuit board. The aperture structure is shaped to receive the flexible cable with the cable conductors in the through holes. A support structure extending from the base serves to hold the connector spaced from the base.

A receptacle assembly in accordance with the present invention establishes electrical connections between a mateable connector and a circuit board. The assembly includes a receptacle connector including a receptacle housing adapted to mate with the mateable connector and a plurality of electrical terminals supported by the receptacle housing. A mounting bracket has a base adapted to be supported adjacent the circuit board. First and second support structures defined on the receptacle housing and on the mounting bracket are engageable with one another for holding the receptacle connector with the terminals spaced from the base. Aperture means extend through the base, and a flexible jumper includes a plurality of conductors each having a first end connected to one of the plurality of terminals and a second end extending through the aperture means and projecting beyond the base for connection to the circuit board.

BRIEF DESCRIPTION OF THE DRAWINGS

FIG. 1 is a perspective view of a receptacle connector assembly constructed in accordance with the present invention and including a mounting bracket constructed in accordance with the present invention;

FIG. 2 is a side elevational view, partly in section, illustrating the assembly and bracket of FIG. 1 as installed with a chassis and circuit board and schematically illustrating a fragment of a meteable connector including a housing and a socket-type female terminal in dotted lines adapted to electrically mate with a male pin terminal also shown in dotted lines provided in a receptacle connector mounted in the assembly of this invention;

FIG. 3 is a top plan view of the mounting bracket of FIG. 1;

FIG. 4 is a front elevational view of the mounting bracket;

FIG. 5 is an end elevational view of the mounting bracket;

DETAILED DESCRIPTION OF THE PREFERRED EMBODIMENTS

Figure 7:
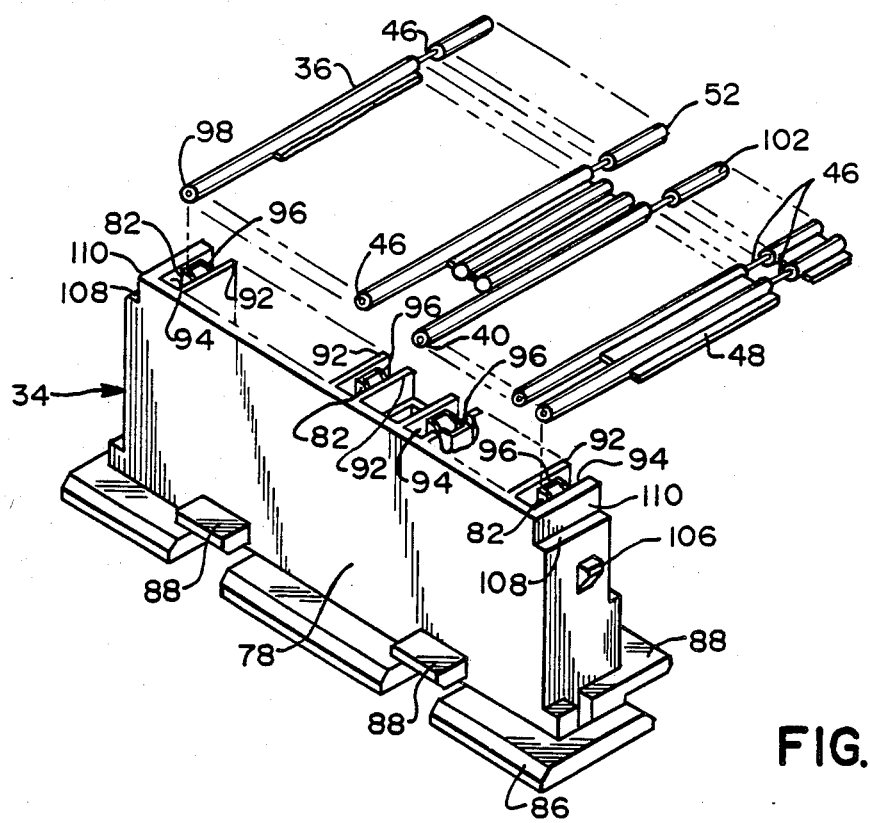
FIG. 7 is a perspective view, partly broken away, illustrating the receptacle connector of the assembly of the present invention and illustrating a portion of an electrical cable prior to termination to the connector.

With reference now to the drawings and initially to FIGS. 1 and 2, there is illustrated a receptacle assembly designated as a whole by the reference character 20 and constructed in accordance with the principles of the present invention. Assembly 20 includes a mounting bracket generally designated as 22 also incorporating features of the present invention.

In general, the receptacle assembly 20 incorporating the mounting bracket 22 serves to facilitate the making of electrical connections between conductive areas on a circuit board 24 (FIG. 2) and terminals such as 26 associated with a mateable, plug-in type connector 28. In addition to the mounting bracket 22, the preferred assembly 20 of the present invention shown in FIG. 2 also includes a grounding bracket 30 serving to mount the bracket 22 upon circuit board 24 within a chassis 32, a receptacle connector generally designated as 34, and a jumper or length of flexible cable 36 extending from the circuit board 24 and mounting bracket 22 to the receptacle connector 34.

A fragment of mateable connector 28 is illustrated in FIG. 2 as an example of one type of multi circuit connector that may be used with the receptacle assembly of the present invention. Receptacle connector 34 of the illustrated embodiments of the invention is adapted to mate with a connector 28 including an insulating housing and a number of terminals 26 of the socket or female contact type arranged in a single line pattern or linear array. Receptacle connectors of different types may be employed to mate with a wide variety of mateable connectors depending upon the circuit and design requirements.

Mounting bracket 22, illustrated in more detail in FIGS. 3–6, includes an enlongated base portion 38 flanked by a pair of foot portions 40, the base portion 38 between the foot portions 40 being slightly elevated as indicated at 42 (FIGS. 4 and 6) to provide a clearance between base portion 38 and circuit board 24. A pair of apertures 44 are provided in foot portions 40 for attachment of the mounting bracket 22 to one of the parallel planar surfaces of the circuit board 24.

Cable 36 is a multi-conductor ribbon cable including a number of conductive wires or conductors 46 jacketed in a body of insulating material 48 including portions surrounding each conductor 46 and web portions between the conductors providing a flat web, strip or ribbon configuration. The receptacle assembly 20 of the present invention is a multi-circuit interconnection device. More particularly, cable 36 includes fifteen conductors 46 terminated in fifteen terminals 82 in receptacle connector 34 which are effective to connect a corresponding number of terminals, such as 26, in a mateable connector 28 to a like number of circuits on circuit board 24. Although a 15-circuit interconnect assembly is shown, other arrangements including different numbers and configurations of conductors and different types of cable may be used if desired.

Base 38 of mounting bracket 22 is provided with an opening or aperture structure 50 for receiving an end 52 of the cable 36. Aperture structure 50 is defined in part by a cable guiding and support structure 54 extending upwardly from base portion 38 between apertures 44. The mouth of aperture structure 50 includes a sloped entry surface 56 for guiding cable end 52 into the aperture structure 50.

At the end 52 of cable 36, the conductors 46 are stripped by removal of insulation 48, and the bare wires are used without intervening connectors or contacts to make electrical connections directly to conductive areas on the circuit board 24. Stop members 58 are provided within the aperture structure 50 to engage the insulation 48 adjacent the stripped conductor ends for limiting insertion and controlling the distance to which the conductors 46 extend below the base portion 38. The stop members 58 divide the aperture structure 50 into three discrete openings or apertures 60, 62 and 64 each receiving a plurality of conductors 46. More or fewer or different types of stop members may be provided for this purpose.

In order to support the receptacle connector 34 with respect to the mounting bracket 22, the bracket 22 includes support structures in the form of a pair of upstanding resilient support arms 66. Preferably, the mounting bracket 22 is formed as an integral, one-piece body of molded, electrically insulating plastic material having a degree of resilience and flexibility permitting the arms 66 to releasably engage the receptacle connector 34 with a resilient, snap fit. Each arm 66 includes a locking recess 68 located below a sloped entry or cam wall 70. A lower shelf or wall 72 and a rear wall 74 are defined adjacent the locking recess 68 to engage and position the receptacle connector 34.

Receptacle connector 34 includes a housing 78 preferably formed as an integral, one-piece body of electrically insulating molded plastic material. Housing 78 is provided with a cavity structure generally designated as 80 within which are supported a number of electrical male terminals 82. In the illustrated arrangement, each male terminal 82 includes a forwardly extending pin contact portion 84 disposed within the cavity structure 80. Cavity structure 80 and contact portions 84 are configured to mate with connector 28 and terminals 26 (FIG. 2). Different configurations of housings, cavities and terminals may be provided if desired.

A flange 86 and an array of upper and lower tabs 88 are provided at the front of housing 78 to facilitate panel mounting of the receptacle connector 34 within the chassis 32. Recesses 90 between the lower tabs 88 are provided for use with a suitable test fixture prior to final installation in the chassis 32.

As can be seen in FIG. 7, the housing cavity structure 80 is subdivided by walls 92 into numerous discrete cavity portions 94 each including one of the terminals 82. The rear portion of each terminal is provided with an insulation displacement contact structure 96 of known configuration including a slot construction for displacing the insulation of and contacting the conductors of an insulated wire terminated to the terminal.

Figure 8:
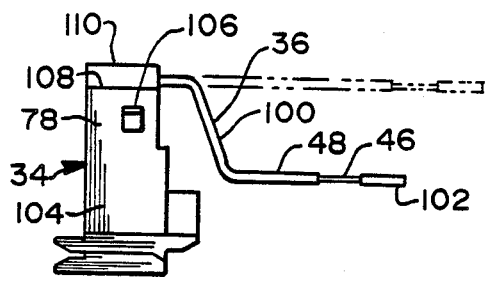
FIG. 8 is an end elevational view of the connector of FIG. 7 after termination and forming of the electrical cable.
Figure 9:
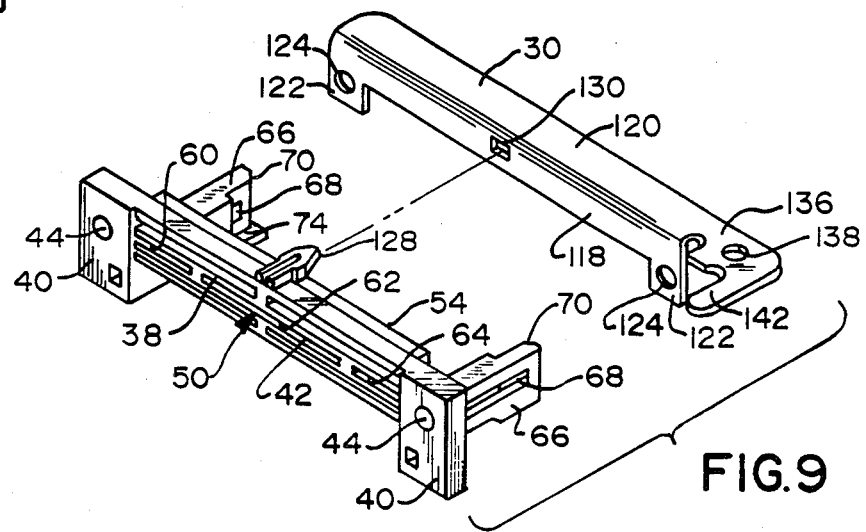
FIG. 9 is a perspective view of the mounting bracket and grounding bracket prior to assembly of these components.

In the manufacture of the receptacle assembly 20, the web portions of the insulating material 48 are notched and removed from an end 98 of the cable 36 as seen in FIG. 7. The notching permits individual ones of the conductors 46 to be terminated to the contacts 96 so that an electrical connection is made between each terminal 82 and each conductor 46. In addition, as illustrated in FIG. 8, the cable 36 is formed with a double bend or bent portion 100 so that the conductors 46 at the end 52 of the cable 36 are properly aligned for insertion into the aperture structure 60 of the mounting bracket 22. In preparation of the cable, as illustrated in FIGS. 7 and 8, a portion 102 of the cable insulation 48 is retained temporarily to maintain alignment of the conductors 46. This portion 102 is removed prior to insertion of the cable end 52 into the mounting bracket 22. Alternatively, depending upon the type and configuration of stops 58, the portion 102 may be retained until mounting of the receptacle assembly 20 on the circuit board 24.

After termination of the cable 36 to the receptacle connector 34, and in accordance with an important feature of the present invention, the connector 34 is supported upon the mounting bracket 22 and the cable end 52 is inserted into the aperture structure 50 of the mounting bracket 22. Side walls 104 of housing 78 are provided with cam shaped latch members 106 cooperating with the locking recesses 68 of the support arms 66. As the connector 34 and cable 36 are lowered onto the mounting bracket 22 (in the orientation of FIGS. 1 and 2) the conductors 46 at cable end 52 enter and project beyond the openings 60, 62 and 64 in the mounting bracket base 38. At the same time, cam surfaces on latch members 106 engage the cam walls 70 on the support arms 66, causing the arms 66 first to resiliently separate and then to snap closed into a locking position as the latch members 106 enter the locking recesses 68.

In the assembled condition, the receptacle connector 34 is supported relative to the mounting bracket 22. A lower wall of the connector housing is supported by the lower walls 72 of the support arms 66, and rearwardly facing walls 108 defined by notches 110 in housing 78 are supported by the rear walls 74 of the support arms 66. A loose fit may be provided between the support arms 66 and the receptacle connector 34 to provide a limited amount of play or freedom of movement to facilitate mounting of the receptacle assembly 20 in the chassis 32.

Figure 6:
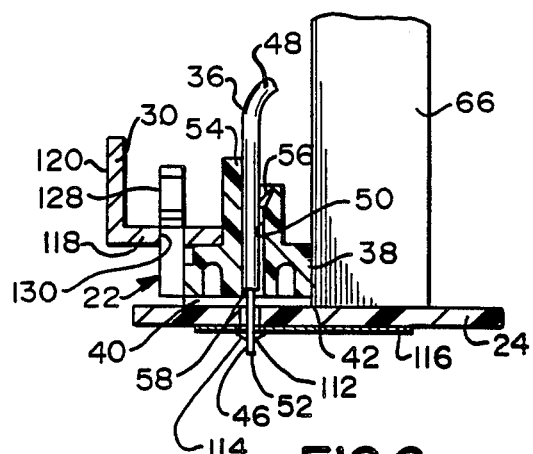
FIG. 6 is a fragmentary sectional view on an enlarged scale taken along the line 6—6 of FIG. 4 illustrating portions of the mounting bracket and a grounding bracket after installation of the receptacle assembly on a circuit board.
Figure 13:
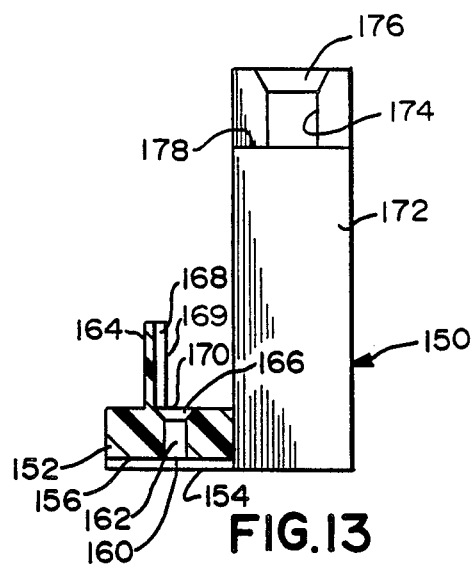
FIG. 13 is a sectional view on an enlarged scale taken along the line 13—13 of FIG. 10.
Figure 10:
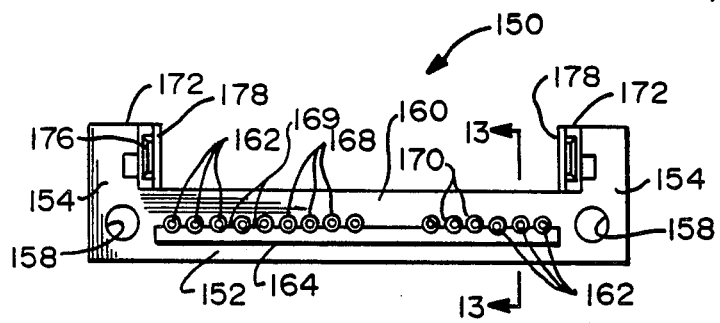
FIG. 10 is a top plan view of a mounting bracket comprising an alternative embodiment of the present invention.
Figure 11:
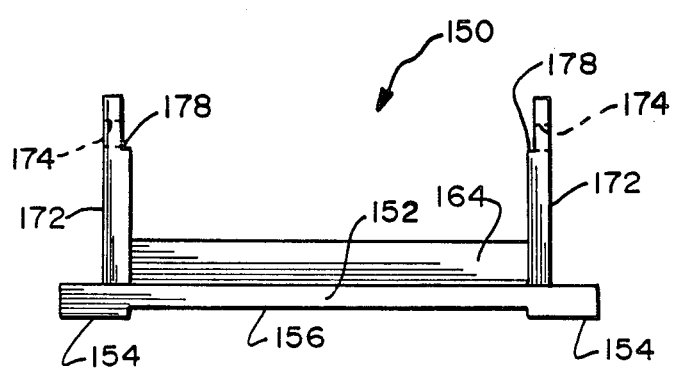
FIG. 11 is a front elevational view of the bracket of FIG. 10.
Figure 12:
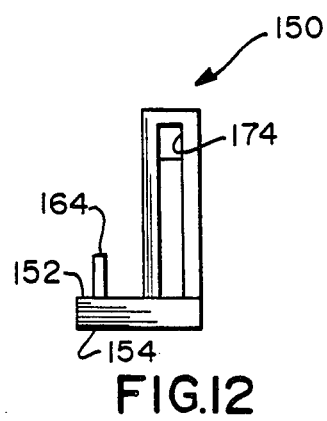
FIG. 12 is an end elevational view of the bracket of FIG. 10.

As best appears in FIG. 1, after the receptacle assembly 20 has been assembled, the ends of the conductors 46 project in an even and well defined pattern beyond the base portion 38 of the mounting bracket 22. In the illustrated embodiment of the invention, this pattern is the same pattern assumed by the conductors 46 in the ribbon cable 36. This pattern matches a similar array of through holes 112 provided in the circuit board 24. Thus, as illustrated in FIG. 6, when the mounting bracket 22 is mounted on circuit board 24, conductors 46 extend through the holes 112 and may be connected by solder 114 to conductive regions 116 on the circuit board 24. This completes electrical circuits between the terminals 82, the conductors 46 and numerous ones of the conductive regions 116.

Grounding bracket 30 is used to clamp the mounting bracket 22 into place upon the circuit board 24. Bracket 30 includes a base portion 118 engageable with the top of the mounting bracket base 38 as well as an upstanding flange portion 120 serving to stiffen the grounding bracket 30 and to assist in positioning the assembly 20 within chassis 32. A pair of tabs 122 extending from base 118 include openings 124. Screws 126 (FIG. 2) extend through the circuit board 24, through the apertures 44 in the mounting bracket 22 and are threaded into the openings 124 in order to clamp the mounting bracket 22 between the grounding bracket 30 and the circuit board 24. The screws 126 may contact grounded conductive regions (not shown) on board 24 thereby to extend a circuit from ground to the grounding bracket 30. Prior to assembly of the mounting bracket 22 to the circuit board 24, the grounding bracket 30 is held in position by engagement of a latch member 128 on mounting bracket 22 with a latch opening 130 in the base 118.

After the mounting bracket 22, grounding bracket 30, receptacle connector 34 and cable 36 of the receptacle assembly 20 have been assembled, these components form a completed subassembly which can be handled, packaged and/or installed as a unit. Since the receptable connector 34 is supported by arms 66 of the mounting bracket 22, special care need not be taken to avoid the application of force or stress to the cable 36. Thus, the use of additional strain relief to protect the terminations of conductors 46 in the insulation displacement contacts 96 is not necessary. In addition, after mounting of the assembly 20 on the circuit board 24, the solder joints 114 between the conductors 46 and the conductive regions 116 of the circuit board do not require special care.

Since the receptacle assembly 20 and board 24 form a unitary subassembly, the installation of this assembly into the chassis 32 or other chassis or panel member is greatly facilitated. The illustrated chassis 32 includes a lower, generally box shaped structure including a bottom wall 132 and a front wall or panel 134 having a aperture or notch for receiving the forward portion of the receptacle connector 34. The assembly 20 is installed simply by lowering it into the chassis and the front wall or panel 134 is received between the tabs 88 and the flange 86. Grounding bracket 30 includes a tab portion 136 with an aperture 138. A screw 140 extends through the front panel 134 into aperture 138 to fasten the assembly 20 in position by drawing the flange 120 against the panel 134. Tab 136 includes a downwardly extending leg 142 acting as a standoff for holding the circuit board 24 above the bottom wall of the chassis to assure that the conductive portions or elements on the board 24 are not shorted by contact with the chassis. Screw 140 assures that the chassis 32 and the grounding bracket 30 are electrically connected together.

In the illustrated arrangement, the chassis 32 includes a cover 144 having a peripheral flange 146. When the cover is installed, the flange 146 is received between the front panel 134 and the flange 86 of the receptacle connector housing 78.

The chassis mounted receptacle assembly 20 of the present invention is ideally suited for environments wherein mechanical shocks, vibrations and the like are encountered. The use of the flexible jumper or cable 36 between the mounting bracket 22 and circuit board 24 on the one hand and the terminals 82 of the receptacle connector 34 on the other hand provides for stress isolation of the solder interconnections 114 at circuit board 24. Thus, shocks or vibrations to which the connector 28 or the connector 34 are subjected are not transferred to the solder joints and the reliability of the electrical connections to circuit board 24 is enhanced. The use of the bent portion 100 of cable 36 contributes to this advantage by permitting the cable 36 to take up any shocks or vibrations without applying axial forces along the conductors 46.

In FIGS. 10-13 there is illustrated a mounting bracket generally designated as 150 comprising an alternative embodiment of the invention that may be used in place of the mounting bracket 22 described above as part of the receptacle assembly 20. In many respects, the mounting bracket 150 is similar to the mounting bracket 22.

Bracket 150 includes a base portion 152 flanked by a pair of foot portions 154 providing a central elevated portion 156 for clearance when the bracket 150 is mounted to a circuit board. A pair of apertures 158 are provided for attaching the bracket 150 to a circuit board.

Base portion 152 of the mounting bracket 150 is provided with an aperture structure 160 for receiving the end of a flexible jumper or cable such as cable 36 described above. In this embodiment of the invention, the aperture structure 160 takes the form of numerous discrete apertures 162 each configured to receive, support and guide a single conductor such as a conductor 46.

Projecting upwardly from base portion 152 is a guiding flange 164. Each opening 162 includes a conical or funnel shaped entry mouth 166, and flange 164 is provided with an aligned series of scallops or recesses 168 defining guide walls 169.

When the stripped end portions of conductors of a cable are inserted into the base portion 152, the guide walls 169 and recesses 168 guide the cable into place. The end portions of the conductors project beyond the bottom of the base portion 152 for insertion into an aligned, matching array of through holes in a circuit board. The insulation of an inserted cable strikes the regions 170 bridging between the openings 162 serving as a stop to limit and control projection of the cable conductors.

Bracket 150 includes a spaced apart pair of support arms 172. Resilient flexibility is provided by forming the mounting bracket 150 as a unitary, one-piece body molded of electrically insulating plastic material. Arms 172 include locking openings or recesses 174, a sloped cam entry wall 176 and a lower support wall 178 for latchingly receiving and positioning, loosely if desired, a receptacle connector such as the connector 34 described above.

We claim:

1. In a connector arrangement for electrically connecting terminals of a mateable connector assembly to conductive regions on a printed circuit board, said arrangement including:
a printed circuit board having a plurality of conductive regions thereon, means mounting a connector on said printed circuit board including a base portion having aperture means therethrough overlying said conductive regions, said connector including a dielectric housing with a plurality of terminal-receiving cavities, a terminal mounted in each of said cavities, each terminal having one end adapted to engage a mating terminal in a mating connector and means electrically connecting the terminal to said conductive regions. the improvement comprising:
said connector mounting means including a mounting bracket having upstanding latch means with shelf support means elevated above the surface of the printed circuit board cooperating with the housing to hold the housing spaced above the base portion; and
and electrical connecting means including a length of flexible insulated multi-conductor cable having a length that is greater than the distance between the terminals and the conductive regions on the printed circuit board,
whereby the connector can be selectively mated and unmated to said mateable connector without damaging the electrical connections with the printed circuit board.

2. The connector arrangement of claim 1, wherein each terminal includes an opposed end including an insulation displacement slot contact portion.

3. The connector arrangement of claim 2, wherein said flexible insulated multi-conductor cable having conductors terminated at one end in said insulation displacement slot contact portions.

4. The connector arrangement of claim 3 wherein said flexible insulated multi-conductor cable comprises ribbon cable including a plurality of conductors with insulation surrounding each conductor and insulating web portions between the conductors, said one end having a notched end portion whereat the web portions between the insulated conductors have been removed prior to termination of said insulated conductors in said insulation displacement slot contact portions.

5. The connector arrangement of claim 1, wherein each conductive region on said printed circuit board includes a through-hole aperture and the aperture means of the base portion overlies each of said through-hole apertures.

6. The connector arrangement of claim 5, wherein said flexible insulated multi-conductor cable includes a first stripped end portion including barred conductor segments extending from an insulated portion and said barred conductor segments extending through the aperture means of the base portion into the aligned through-hole apertures.

7. The connector arrangement of claim 6, wherein each terminal includes an opposed end including an insulation displacement slot contact portion and said flexible insulated multi-conductor cable having conductors terminated at a second end portion in said insulation displacement contact portions.

8. The connector arrangement of claim 7 wherein the length of flexible insulated multi-conductor cable comprises ribbon cable and said second end includes a notched end portion whereat insulated web portions between insulated conductors have been removed.

9. The arrangement of claim 7, wherein the barred conductor segments are electrically connected to said conductive regions with solder.

10. The arrangement of claim 1 wherein the flexible insulated multi-conductor cable having conductors electrically connected to said conductive regions with solder.

11. A connector arrangement comprising:
a printed circuit board having a plurality of conductive regions thereon, each region including a through-hole aperture;
a mounting bracket mounted on the printed circuit board including the base portion having aperture means extending therethrough overlying said through-hole apertures and upstanding latch arms with latch receiving recesses and shelf support means elevated above said base portion;
a connector including a dielectric housing including a bottom wall, a pair of opposed sidewalls with latch projections extending outwardly therefrom, a forward mating end, an opposed rearward end, a plurality of terminal-receiving cavities extending between said mating end and said rearward end, a terminal mounted in each of said cavities, each terminal having one end adjacent said forward mating end adapted to electrically engage a mating terminal in a mateable connector and an opposed end adjacent said rearward end including an insulation displacement slot contact portion, said connector mounted in said mounting bracket so that the bottom wall of the housing rests on the shelf support means and said latch projections are received within the latch receiving recesses in said latch arm to releaseably retain the connector spaced above the base portion;

an insulated multi-conductor cable including a stripped first end including barred segments of cable conductors extending from the insulated portion, said first end extending into said aperture means of the base portion with the barred conductor segments extending into said through-hole apertures and soldered to a conductive region and a second end of each of said cable conductors being terminated in one of said insulation displacement contact portions, said multiconductor cable being of a length sufficient to provide a bend in said cable between the connector and the base portion.

whereby, the connector may be selectively mated and unmated to said mateable connector without damaging the electrical connections with the printed circuit board.

12. A connector arrangement for making an electrical connection to a printed circuit board associated with a panel, said arrangement comprising:

a printed circuit board including a plurality of conductive regions thereon;

a panel mounted connector including a housing supported on the panel and a plurality of terminals supported within said housing;

a mounting bracket having a base portion overlying the circuit board;

a grounding bracket overlying a portion of said base clamping said base against the circuit board;

aperture means in said base extending toward the circuit board;

a flange on said grounding bracket adapted to be attached to the panel;

a stand-off on said grounding bracket for positioning said mounting bracket and the circuit board relative to the panel;

a length of flexible insulated multi-conductor cable having conductors with second ends connected to said terminals and first ends extending through said aperture means connected to the circuit board; and support means on said base engaging said housing and supporting said connector spaced from said base.

* * * * *